United States Patent [19]

Huang et al.

[11] Patent Number: 4,467,028

[45] Date of Patent: Aug. 21, 1984

[54] ACID INTERLAYERED PLANOGRAPHIC PRINTING PLATE

[75] Inventors: Jen-chi Huang, Ossining; James Shelnut, Mahopac, both of N.Y.

[73] Assignee: Polychrome Corporation, Yonkers, N.Y.

[21] Appl. No.: 397,659

[22] Filed: Jul. 12, 1982

[51] Int. Cl.$^3$ .................................... G03F 7/02

[52] U.S. Cl. .................................... 430/302; 430/11; 430/14; 430/271; 430/278; 430/526; 101/456; 101/459

[58] Field of Search ............... 430/271, 278, 161, 526, 430/954, 302, 11, 14; 101/456, 459

[56] References Cited

U.S. PATENT DOCUMENTS

| | | | |
|---|---|---|---|
| 2,922,715 | 1/1960 | Gumbinner | 430/159 |
| 2,946,683 | 7/1960 | Mellan et al. | 430/302 |
| 3,136,636 | 6/1964 | Dowdall et al. | 430/302 |
| 3,298,852 | 1/1967 | Beatty et al. | 430/302 |
| 3,634,078 | 1/1972 | Uhlig | 430/161 X |
| 4,376,814 | 3/1983 | Walls | 430/272 |
| 4,388,156 | 6/1983 | Gillich et al. | 204/14 N |

*Primary Examiner*—John E. Kittle
*Assistant Examiner*—José G. Dees

[57] ABSTRACT

A planographic printing plate comprises an anodized metal substrate, an interlayer on the substrate and a photosensitive layer on the interlayer in which the interlayer is a hydroxy-substituted organic acid.

13 Claims, No Drawings

ACID INTERLAYERED PLANOGRAPHIC PRINTING PLATE

BACKGROUND OF THE INVENTION

In general, photosensitive printing plates are classified as planographic plates, intaglio plates and relief plates. The photosensitive planographic printing plate is produced by rendering the surface of a support hydrophilic by treating the surface either chemically or physically or by coating a hydrophilic polymer on the surface, followed by applying a suitable photosensitive material on the thus prepared hydrophilic surface.

Typical surface treatments include mechanical surface treating such as brush graining, or chemical surface treating such as electrolytic graining and/or etching, and/or anodizing, and/or chemical surface treating which applies a further layer such as an alkali metal salt of phosphoric acid, a silicate, potassium fluorozirconate or anodic oxidation.

For a period of time, most lithographic plates were prepared from grained zinc plates which had been coated with a suitable photosensitive composition, dried, promptly exposed to secure the desired image, followed by applying a developing ink to the entire surface of the plate which was then washed with water to eliminate any water-soluble materials and developing ink. A gum arabic solution was thereafter applied to the printing surface of the plate to protect it until it was ready for use. The gum arabic provided chemical protection to the image and was easily washed off with water when it was desired to use the plate.

Jewett et al. in U.S. Pat. No. 2,714,066 describe a planographic printing plate formed from a thin metal sheet having at least one surface thereof treated to provide a tightly bonded, thin, preferably inorganic, hydrophilic surface treatment, formed from a solution of an alkali metal silicate, salicyclic acid, or other treating agent which will form a permanently hydrophilic scum-preventing and tone-reducing film overlaying and in firmly bonded contact with the surface of the plate, and having a coating of a light-sensitive organic material over the hydrophilically treated surface, i.e. over the surface of the scum-preventing and tone reducing film. The preferred substrate is an aluminum foil or sheet material which has been cleaned, for example, by immersion in a solution of trisodium phosphate.

The present invention is particularly concerned with presensitized plate systems in which the metal substrate has been prepared for application of the photosensitive material by anodizing. One problem which has historically plagued anodized presensitive plate systems has been background by resins, dyes, photosensitive materials, additives and the like. The natural porosity of the freshly anodized layers results in the absorption of materials of the photosensitive layer into the oxidized layer if the resultant layers are not sealed or interlayered during the manufacturing process with a suitable agent, for example, sodium silicate, rendering the area lipophilic causing ink to adhere to said absorbed material. However, it is well known that the organic nature of sensitizers, resins, additives and dyes gave rise to a shorter press life when such inorganic interlayers are employed. As a result, the use of silicate sealing or interlayering have generally been limited to medium and short run plates.

In order to minimize the background staining without adversely affecting press life, various approaches have been utilized by companies manufacturing anodized presensitized plates. These include the selection of dyes which visually do not appear to stain when examined by the naked eye, resin selection which will not permeate the anodizing pores but be lifted during developer treatment, etc. This approach, however, limits selection of the dyes, resins, photosensitive materials and additives, and may, on occasion, create differences in the ink/water balance during a press run. Attempts to use lower concentrations of dyes have also been attempted but this generally limits the print out, between image and non-image areas, and contrast, between image and background areas. Another approach has been attempts to optimize anodizing conditions in order to avoid the porous layer formation. None of these compromises has been totally satisfactory.

One attempt to circumvent the various compromise approaches is to seal the anodized presensitized plate with an aqueous solution of polyvinyl phosphonic acid. This system retains the high print out and high contrast characteristics of the plate, generally eliminates the staining, and generally improves the image deletion, water/ink balance (press tinting), exposure, and shelf life. The press life, however, is about 25% reduced mainly due to sealing or interlayering chemicals with poor adhesion between anodic oxide and the coating in the image area.

It is accordingly the object of this invention to provide a new planographic printing plate in which the background dye staining problem is significantly overcome without substantially adversely affecting the press life and other desired characteristics of the planographic printing plate. This and other objects of the invention will become apparent to those skilled in the art from the following detailed description.

SUMMARY OF THE INVENTION

This invention relates to a planographic printing plate and more particularly to a planographic printing plate which is an anodized metal substrate having an interlayer of a hydroxy-substituted organic acid thereon and a photosensitive layer on the interlayer.

DESCRIPTION OF THE INVENTION

When an anodic oxide was freshly made, the anodic oxide surface is very active, and has a propensity to absorb dyes and gases especially in its oxide pores. This absorbing characteristic decreases spontaneously with time, and this was attributed to a reaction between the anodic aluminum oxide and the wter vapor in the air. For industrial purposes, especially for architecture, most of the anodized oxide was properly sealed in the oxide pore using hot water, steam, dichromate, sodium silicate, nickel acetate, cobalt acetate, etc. in order to promote the corrosion resistance. Therefore, most of the sealed anodic oxide has an excellent alkaline resistance, a measurement of corrosion resistance. In this invention, the interlayer, has an effect to seal the reaction between the photosensitive coating as well as organic dyes in developing ink and anodic oxide but not necessarily to be as corrosion resistant as a regular sealing operation in the anodizing industries.

The substrate used in forming a positive or negative acting lithographic printing plate of the present invention can be any of the metal substrates which have been heretofore used for this purpose. Among the various support materials which can be utilized are zinc, iron or steel, copper, lead, tin, chromium, magnesium, tantalum, titanium and preferably aluminum, including aluminum alloys such as the alloys of predominantly aluminum with silicon, iron, zinc, copper, manganese, magnesium, chromium, zirconium and the like. The substrate can be grained if desired in a conventional fashion and then anodized also in the conventional fashion. For example, an aluminum plate can be anodized by subjecting the plate to anodic oxidation using the plate as the anode in an aqueous or solvent based acid such as sulphuric acid, oxalic acid, boric acid, phosphoric acid, sulfamic acid, chromic acid and the like at 1–80 weight percent concentration, an electrolyte temperature of 5°–70° C., a current density of 0.5–60 A/dm$^2$, a voltage of 1–600 volts and a time of 30 seconds to 50 minutes.

In order to overcome the natural activity of the anodized substrate, the substrate is contacted with a solution of a hydroxy-substituted organic acid. The acid can be monohydroxy substituted or polyhydroxy substituted and the acid is preferably a carboxylic acid which may have one or more acid substituents. Typical examples include hydroxyacetic acid; 2,3-dihydroxylpropionic acid; 2,3-bis(hydroxymethyl)-propionic acid; tartaric acid; gluconic acid; or any such acid included in the following general formula:

$$X-(\underset{Y}{\underset{|}{CH}})_n-(\underset{Z}{\underset{|}{CH}})_m-COOH$$

X = H, alkyl, aryl, COOH
Y = H, OH, alkyl, aryl, COOH
Z = H, OH, alkyl, aryl, COOH,
Y and Z consisting of at least one OH group.
m = 0–5
n = 0–5

Mixtures of the interlayer agent can be employed if desired. As a general rule, the amount of the acid in the solution is about 0.1–30 weight percent, preferably about 1–20 weight percent. It is more convenient to regulate the amount of acid in the solution by the solution pH. Thus, while the solution pH can be about 1–6, it is preferable to employ an amount of acid suitable to achieve a solution pH of about 1–2.5. The amount of acid necessary to achieve these pH's will vary depending on the particular acid and the solvent. For example, about 0.494 grams gluconic acid per liter will give rise to a pH of 5 in aqueous solution while a pH of 2 requires about 223.4 grams per liter. 0.73 g/l tartaric acid and 2 g/l dimethylolpropionic acid will give rise to a pH of about 5 in aqueous solution while a pH of 2 is realized with 17 g/l and 123 g/l, respectively. The nature of the solvent is not restricted so long as it is substantially inert and can be water or an organic solvent such as methylene chloride. Aqueous solvents are preferred.

The anodized metal substrate is contacted with the acid solution for a time sufficient to form an interlayer, which is probably little more than a monomolecular layer, on the substrate. This generally requires about 5–120 seconds although longer time periods can be used if desired. The preferable length of contact varies depending on the particular hydroxy-substituted organic acid being employed, its concentration in the solvent and the nature of the solvent. The appropriate length of time can be readily optimized for any given system. The manner in which contact is effected is not particularly restricted and the organic acid solution can be sprayed on the anodized metal substrate, the substrate can be immersed in the hydroxy-substituted organic acid solution or the solution can be roller-coated on the substrate, as desired. Following the contacting, the substrate surface is preferably washed with water or the other solvent under ambient temperature conditions and dried.

A suitable photosensitive layer is deposited on the interlayered anodized metal substrate and processed in the conventional fashion. Positive type light-sensitive compositions are often o-quinone diazide type light sensitive materials alone or in combination with appropriate additives. On exposing the light sensitive plate to actinic radiation through an image bearing lithographic flat, the o-quinone diazide type light sensitive material of the exposed area decomposes and becomes alkaline soluble and is therefore easily removed by an aqueous alkaline solution to provide a positive image. In the areas where the aqueous alkaline solution has removed the alkaline soluble light sensitive material, the hydrophilic surface is exposed and will receive water and repel ink. The areas remaining as an image are oleophilic and accept the ink. Many positive type light sensitive materials are known and can be used in the present invention without restriction. Negative type light sensitive materials can also be employed in which the areas not exposed to actinic radiation are removed by alkali or otherwise to leave the surface hydrophilic.

The processed plate is ready to be placed on a lithographic press without further treatment and be used in printing or reproducing the desired writings or images. It is customary, however, before placing the plate on a lithographic press, to treat the printing surface of the plate with what is known in the art as an "image developer." The image developer can take various forms and one example is a pigmented resin emulsion which will adhere to the ink-receptive areas but will not adhere to the hydrophilic areas of the plate. A printer's developing ink can also be used as an image developer. As a result of the interlayer treatment of the present invention, the background dye staining typically encountered upon the use of such a developing ink is substantially avoided. Another post treatment which is customary is to apply a gum to the entire plate which will protect is from air oxidation during storage.

In order to further illustrate the present invention, various examples are set forth hereinafter. In these examples, as well as throughout this specification and claims, all parts and percentages are by weight and all temperatures are in degrees Celsius unless otherwise indicated.

EXAMPLE 1

Comparative Example

A freshly anodized pumice grained and etched aluminum plate was well rinsed, squeegeed and dried for 15 seconds in hot air at 97° C. Thereafter a photosensitive composition consisting of 63.4 parts of an alkali soluble phenolic resin such as Alnoval PN-430 (Hoechst), 33 parts of the reaction product of 2-diazo-1,2-naphthoquinone-5-sulfonyl chloride with a phenolic resin such as Alnoval PN-430, 2 parts of a polyurethane resin, 1.6 parts of organic dyes that are acid sensitive. Dissolved in 30 parts of methyl isobutyl ketone, 30 parts of primary amyl acetate, 20 parts of methyl ethyl ketone and 20 parts of ethylene glycol monoethyl ether by volume is applied to the plate and processed in a conventional manner. After water rinse and dry, an image remover such as 233 of Polychrome was applied on the interface of the imaged and non-imaged areas with an area about the size of a quarter coin for 45 seconds. Water rinse and dry. The optical density on the image remover treated area and the non-treated area are measured. The difference of optical density between these two areas indicates the degree of staining. The lower the difference of optical density, the lesser the staining. The difference in background between the areas of image remover and those untreated, measured a MacBeth reflectance densitometer, using a black filter on plates that were aged at 100° C. for 30 minutes had a difference in measurement of 0.09.

EXAMPLE 2

Example 1 was repeated except that after drying the aluminum plate in hot air, the plate was immersed for 10 seconds in a 30° C. solution containing 223.4 grams per liter aqueous gluconic acid (pH 2.0) followed by a cold water rinse and then the photosensitive layer was applied. The change in optical density was found to be 0.04.

EXAMPLE 3

Example 2 was repeated except that in place of the aqueous gluconic acid, a 17 g/l aqueous solution of tartaric acid (pH 2.0) was employed. The change in optical density was found to be 0.03.

EXAMPLE 4

Example 2 was repeated except that in place of the gluconic acid, an aqueous solution of 123 g/l dimethylolpropionic acid was employed and the resulting change in optical density was found to be 0.01.

EXAMPLE 5

Example 2 was repeated except that in place of gluconic acid, an aqueous solution of 26.7 g/l hydroxyacetic acid (pH=2) was employed and the resulting change in optical density was found to be 0.03.

EXAMPLES 6-11

Following the procedure of Example 2, an aluminum base was pumice grained, alkaline etched and freshly anodized in 20% $H_2SO_4$, rinsed in cold water and then dipped into an aqueous hydroxy acid solution at room temperature for 60 seconds followed by a 30 second cold water rinse before application of the photosensitive coating of Example 1. The aqueous hydroxy acid solutions contained gluconic acid at 0.494 g/l (pH 5); and 223.4 g/l (pH 2); tartaric acid at 0.73 g/l (pH 5) and 17 g/l (pH 2); and dimethylolpropionic acid at 2 g/l (pH 5) and 123 g/l (pH 2). The plates were then exposed and developed. All of the treated plates were tested as in Example 1 showed a clean background and clean image ring on the non-image area for up to 7 days at 60° C. The test showed that the low pH (2.0) treated samples prevented staining better than the pH 5 solutions.

EXAMPLES 12 AND 13

Plates prepared in the manner of Example 2 and Example 5 were coated with a solution consisting of 30.7 parts of a negative working diazo sensitizer such as the reaction product of 2-benzoyl-4-sulfo-5-methoxy phenol with para-diazodiphenylamine-formaldehyde condensate, 30.7 parts of an epoxy resin such as Epon 1007 (Shell) 25.0 parts of polyurethane resin, 7.7 parts of a formal resin of polyvinyl alcohol, 4.1 parts of image producing dye and 1.1 parts of $H_3PO_4$. When either plate was exposed and treated conventionally and tested in the manner described in Example 1, it was found that clean background resulted.

Various changes and modifications can be made in the process and products of this invention without departing from the spirit and scope thereof. The various embodiments which have been disclosed herein were for the purpose of further illustrating the invention, but were not intended to limit it.

What is claimed is:

1. A presensitized planographic printing plate comprising an anodized metal substrate, an interlayer directly on the substrate and a photosensitive layer on the interlayer, wherein the interlayer comprises a hydroxy substituted organic acid selected from the group consisting of gluconic acid, tartaric acid, hydroxy propionic acid, and hydroxy acetic acid.

2. The presensitized planographic printing plate of claim 1, wherein the metal substrate is an aluminum or aluminum alloy substrate.

3. The presensitized planographic printing plate of claim 2, wherein the anodized aluminum or aluminum alloy substrate is grained or grained and etched.

4. A method of forming the presensitized planographic printing plate of claim 1, comprising contacting an anodized metal substrate with a solution of a hydroxy substituted organic acid selected from the group consisting of gluconic acid, tartaric acid, hydroxy propionic acid, and hydroxy acetic acid and thereafter applying a photosensitive layer on the treated surface of the metal substrate.

5. The method of claim 4, wherein the anodized metal substrate is grained or grained and etched the hydroxy substituted organic acid is a monohydroxy or polyhydroxy carboxylic acid in aqueous solution.

6. The method of claim 5, wherein the organic acid treated substrate is washed with water before application of the photosensitive layer.

7. The method of claim 4, wherein said presensitized plate is of a positive or negative character.

8. An imaged planographic printing plate comprising an anodized metal substrate, an interlayer directly on the substrate and a developed photosensitive layer on preselected portions of the interlayer, wherein the interlayer comprises a hydroxy substituted organic acid selected from the group consisting of gluconic acid, tartaric acid, hydroxy propionic acid, and hydroxy acetic acid.

9. The imaged planographic printing plate of claim 8, wherein the metal substrate is an aluminum or aluminum alloy substrate.

10. The imaged planographic printing plate of claim 9, wherein the anodized aluminum or aluminum alloy substrate is grained.

11. A method of forming the imaged planographic printing plate of claim 8, comprising contacting an anodized metal substrate with a solution of a hydroxy substituted organic acid from the group consisting of gluconic acid, tartaric acid, hydroxy propionic acid, and hydroxy acetic acid to form directly an interlayer applying a photosensitive layer on the treated surface of the metal substrate, exposing preselected portions of the photosensitive layer to light and contacting the light exposed surface with an agent capable of removing undeveloped portions of the photosensitive layer.

12. The method of claim 11, wherein the anodized metal substrate is grained or grained and etched the hydroxy substituted organic acid is a monohydroxy or polyhydroxy carboxylic acid in aqueous solution.

13. The method of claim 11, wherein the organic acid treated substrate is washed with water before application of the photosensitive layer.

* * * * *